(12) United States Patent
Lee

(10) Patent No.: US 7,864,581 B2
(45) Date of Patent: Jan. 4, 2011

(54) RECOVERY METHOD OF NAND FLASH MEMORY DEVICE

(75) Inventor: Ju Yeab Lee, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/297,610

(22) Filed: Dec. 7, 2005

(65) Prior Publication Data

US 2006/0227611 A1    Oct. 12, 2006

(30) Foreign Application Priority Data

Apr. 11, 2005    (KR) .................... 10-2005-0030023

(51) Int. Cl.
*G11C 16/04*    (2006.01)
(52) U.S. Cl. ................................ 365/185.17
(58) Field of Classification Search ............. 365/185.17
See application file for complete search history.

(56) References Cited

U.S. PATENT DOCUMENTS

| | | | | |
|---|---|---|---|---|
| 5,963,475 A | * | 10/1999 | Choi et al. | 365/185.11 |
| 6,434,055 B2 | * | 8/2002 | Tanaka et al. | 365/185.3 |
| 2003/0112660 A1 | * | 6/2003 | Lin et al. | 365/185.01 |

FOREIGN PATENT DOCUMENTS

| KR | 10-1995-0000273 B1 | 1/1995 |
|---|---|---|
| KR | 10-2000-0004214 A | 1/2000 |

* cited by examiner

*Primary Examiner*—Hoai V Ho
*Assistant Examiner*—Anthan T Tran
(74) *Attorney, Agent, or Firm*—Townsend and Townsend and Crew LLP

(57) ABSTRACT

A NAND flash memory device is recovered by applying a predetermined bias to a drain or a source. A negative bias is applied to a cell gate so that electrons are injected into a floating gate of a cell. This narrows the distribution of an erase threshold voltage and minimizes interference from states of peripheral cells.

7 Claims, 4 Drawing Sheets

RECOVERY METHOD OF NAND FLASH MEMORY DEVICE

BACKGROUND OF THE INVENTION

The present invention relates to integrated circuits and more particularly, the present invention relates to a recovery method for a NAND flash memory device.

A NAND flash memory device comprises a plurality of cell blocks. Each of the cell blocks includes a plurality of cell strings. A plurality of cells for storing data are connected in series to form a string. A drain select transistor is formed between the cell strings and a drain and a source select transistor is formed between the cell string and a source.

In a conventional cell of a NAND flash memory device, an isolation region is provided in a semiconductor substrate. The isolation region can be formed using for example, a Shallow Trench Isolation (STI) process. A gate structure is formed in a region of the semiconductor substrata. The gate structure comprises a tunnel oxide layer, a floating gate, a dielectric layer, and a control gate. A junction is formed on each sides of the gate structure.

Certain limitations exist with the conventional NAND flash memory device. As the design rule is reduced, distance between cells is reduced. The state of a cell may be influenced by the state of a neighboring cells. For example, a threshold voltage of a program cell can be influenced by a threshold voltage of peripheral cells during a programming operation. When the peripheral cells are excessively erased, the threshold voltage of the program cell is changed accordingly. Therefore, the distribution characteristic of the threshold voltage of the program cell is changed leading to chip failure. These and other limitations will be described in more detail throughout the present specification.

BRIEF SUMMARY OF THE INVENTION

According to present invention, a recovery method for a NAND flash memory device is provided. In particularly, the present invention provides a method to eliminate an interference effect due to a difference between a threshold voltage of an erase cell and a threshold voltage of a program cell. A person skilled in the art would recognize that the invention has a much broader range of applicability. For example, the invention can be applied to a variety of devices such as dynamic random access memory devices, application specific integrated devices, microprocessors, microcontrollers, among others.

In a convention method for recovery a NAND flash memory device, a threshold voltage of an erase cell is substantially lower than a threshold voltage of an erase verify. As a result, the threshold voltage of the erase cell is different form a threshold voltage of a program cell. Such a difference causes interference and impacts on the recovery of the device.

According to an embodiment of the present invention, a recovery method for a NAND flash memory device is provided. The recovery method includes providing a semiconductor substrate. A plurality of cell strings are provided. Each of the plurality of cell strings comprises a plurality of cells connected in series formed in the semiconductor substrate. The method includes providing a drain select transistor and a source select transistor. The drain select transistor is formed between a cell string and a drain. The source select transistor is formed between the cell string and a source. The method includes applying a first predetermined bias to the drain through a selected bit line after the device is erased, a second predetermined bias to the drain select transistor, and the source select transistor of a selected cell block, and a ground to the source.

In a specific embodiment, the first predetermined bias and the second predetermined bias are substantially the same. In an alternative embodiment, the second predetermined bias is (more negative?) than the first predetermined bias. In certain embodiments, the ground voltage may be applied to the drain select transistor and the source select transistor of a non-selected cell block.

The method also provides an erase threshold voltage for the cells. The erase threshold voltage may be controlled by applying a negative bias to a cell gate of a selected cell block. Alternatively, a cell gate of a non-selected cell block may be floated.

The method also includes increasing a current between the drain and the source by applying a negative bias to the semiconductor substrate.

Accordingly, an interference effect as a result of a difference between a threshold voltage of an erase cell and a threshold voltage of a program cell is reduced. Since the threshold voltage of a program cell is unchanged, the threshold voltage of an erase cell is raised to reduce a difference between the threshold voltage of the program cell and the threshold voltage of the erase cell.

According to an alternative embodiment of the present invention, a recovery method for a NAND flash memory device is provided. The method includes providing a semiconductor substrate. The method includes providing a plurality of cell strings. Each of the cell strings comprises a plurality of cells connected in series formed in the semiconductor substrate. A drain select transistor and a source select transistor are formed between a first cell string and a second cell string. To recover the NAND flash memory device after erase, a first predetermined bias is applied to the source, a second predetermined bias is applied to the drain select transistor and the source select transistor of a selected cell block, and a ground is applied to the drain.

In a specific embodiment, the first predetermined bias is substantially the same as the second predetermined bias. In an alternative embodiment, the second predetermined bias is more negative than the first predetermined bias. In certain embodiments, the ground voltage may be applied to the drain select transistor and the source select transistor of a non-selected cell block.

The method also includes providing an erase threshold voltage for the cells. The erase threshold voltage may be controlled by applying a negative bias to a cell gate of a selected cell block. The cell gate of a non-select cell block may be floated in certain embodiments.

The method includes providing a mean to increase a current between a drain and a source. In a specific embodiment, the current between the drain and the source may be increased by applying a negative bias to the semiconductor substrate.

Accordingly, an interference effect as a result of a difference between a threshold voltage of an erase cell and a threshold voltage of a program cell is reduced. Since the threshold voltage of a program cell is unchanged, the threshold voltage of an erase cell is raised to reduce a difference between the threshold voltage of the program cell and the threshold voltage of the erase cell.

DETAILED DESCRIPTION OF THE INVENTION

The present invention will now be described in connection with specific embodiments with reference to the accompanying drawings. According to present invention, techniques including method for programming a semiconductor devices are provided. More particularly, the invention provides a method for recovering a NAND flash memory device.

Figure 1:
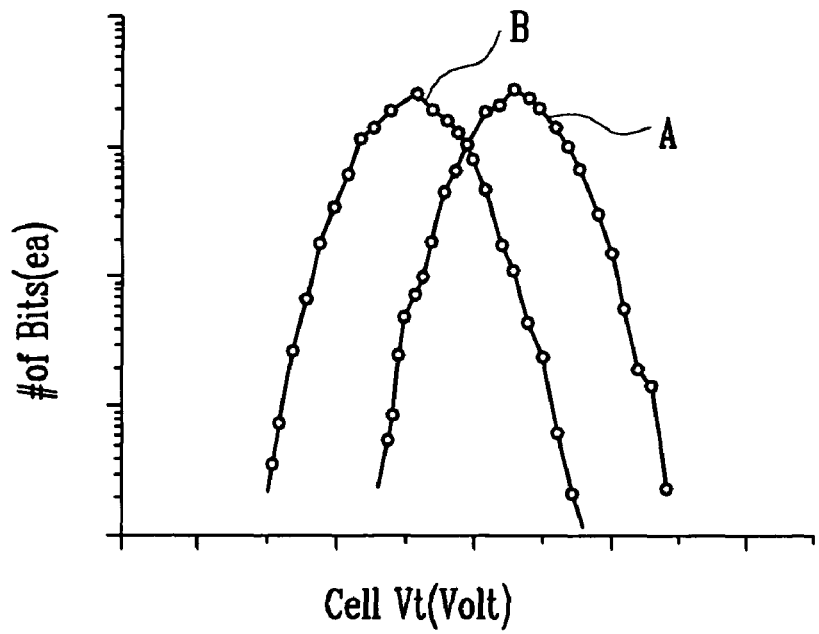
FIG. 1 is a simplified graph showing the distribution of a program threshold voltage of a conventional NAND flash memory cell.

FIG. 1 is a simplified graph showing the distribution of a program threshold voltage of a conventional NAND flash memory cell. As shown in FIG. 1, the distribution of a cell threshold voltage where a peripheral cell is programmed (A) is quite different from the distribution of a cell threshold voltage where the peripheral cell is erased (B). When a cell is programmed after being erased, the threshold voltage of the cell can be significantly different depending on state of peripheral cells.

Figure 2:
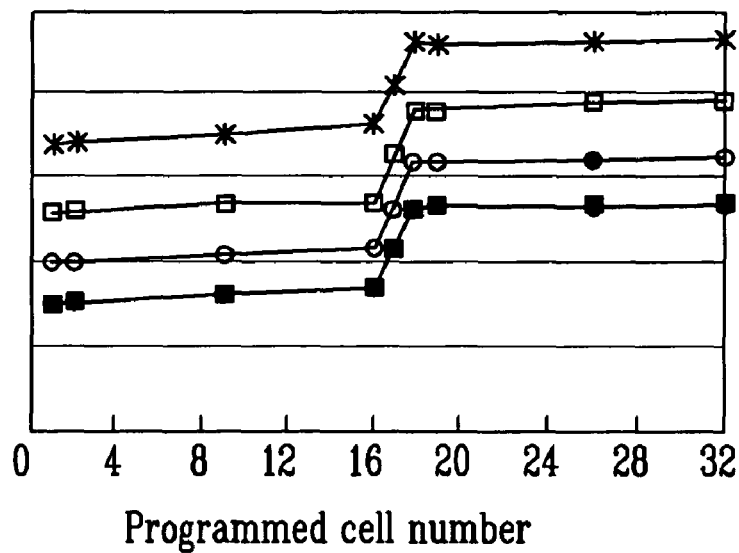
FIG. 2 is a simplified graph showing the variations in threshold voltage of an entire cell string while programming a cell of a cell string.

FIG. 2 is a simplified graph showing a result of monitoring variations in cell threshold voltage of cells strings while programming the seventeenth cell of the cell string. As shown in FIG. 2, when programming cells other than the sixteenth and the eighteenth cells in a cell string, variation in threshold voltage in remaining cells in the cell string is very small. However, when the sixteenth and the eighteenth cells are programmed, the variation of threshold voltage is relatively large. This is because a difference between an erase threshold voltage and a program threshold voltage of the sixteenth and the eighteenth cells is influenced by threshold voltage of the seventeenth cell. Therefore there is a need to minimize the interference effect of neighboring cells.

FIGS. 3-6 are simplified diagrams illustrating a method of recovering a NAND flash memory device according to embodiments of the present invention.

Figure 3:
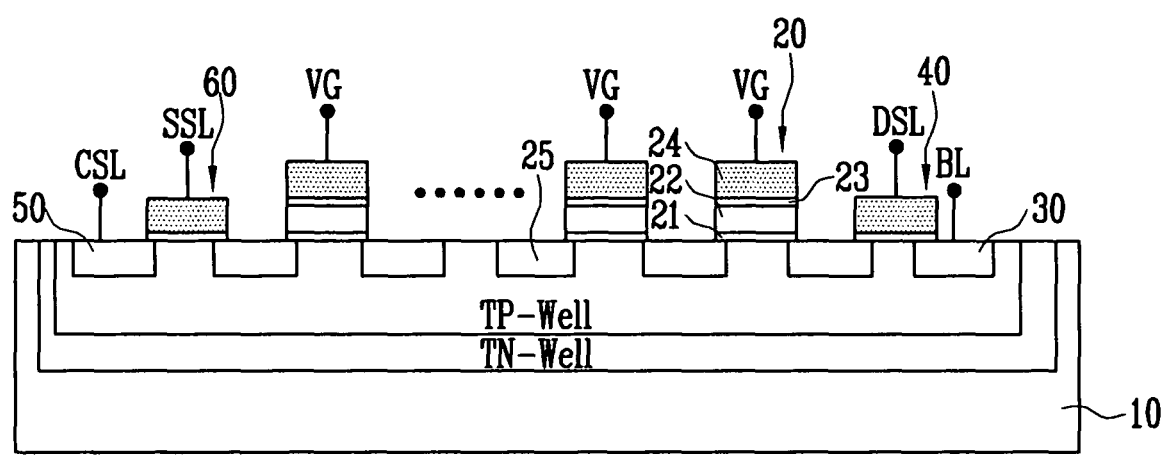
FIG. 3 is a simplified sectional view of a cell string illustrating principle of a recovery method for a NAND flash memory device according to an embodiment of the present invention.

Referring to FIG. 3, a cross sectional view of a cell string for of a NAND flash memory device according to the present invention is shown. A semiconductor substrate 10 is provided. A plurality of cells 20 connected in series are provided in a triple well structure in semiconductor substrate 10 forming a cell string. Each of the cells comprises a stack gate. The stack gate comprises a tunnel oxide 21, a floating gate 22, a dielectric layer 23, and a control gate 24. The stack gate also comprises a first side and a second side. A junction 25 is formed on the first side and on the second side of the stack gate.

A drain select transistor 40 is formed between a drain 30 and the cell string. A source select transistor 60 is formed between a source 50 and the cell string. A first predetermined bias is applied to drain 30 through a bit line BL. A second predetermined bias is applied to source 50 through a common source line CSL. In addition, a third predetermined bias is applied to drain select transistor 40 and source select transistor 60 through a drain select line DSL and a source select line SSL respectively.

When a bias is applied to bit line BL after the cell is erased, electrons flow from source 50 to drain 30. Some of the electrons are injected into floating gate 22. The higher a current between drain 30 and source 50, the greater the number of electrons being injected into floating gate 22. As merely an example, a 5 volt is applied to drain 30, to drain select transistor 40 and to source select transistor 60 through the bit line. A 5 volt is also applied through the drain select line and the source select line. A ground voltage (Vss) is then applied to source 50 and drain 30 resulting in a cell gate voltage (VG) at ground. The threshold voltage of an erased cell has a negative potential. As a result, the entire string of cells are turned on and current flows between drain 30 and source 50. Electrons within channels are injected into floating gate 22 by the current and the cell is recovered to a weakly programmed state.

The recovery is easily performed. Due to a low erase threshold voltage and an increased current flow between the drain and the source, difference in voltage applied to an tunnel oxide film is high when a cell is excessively erased. If the threshold voltage of the erased cell is a predetermined level, e.g., −1.5V when gate voltage is at zero volt, the cell changes from a saturation regime to a linear regime according to a transconductance characteristic ("Gm" characteristic) of the cell. Therefore, cell current is abruptly lowered and flow of electrons is stopped accordingly. Electrons are no longer injected into the floating gate. The erase threshold voltage after recovery can be kept to a predetermined level according to a negative bias applied to the gate.

Figure 4:
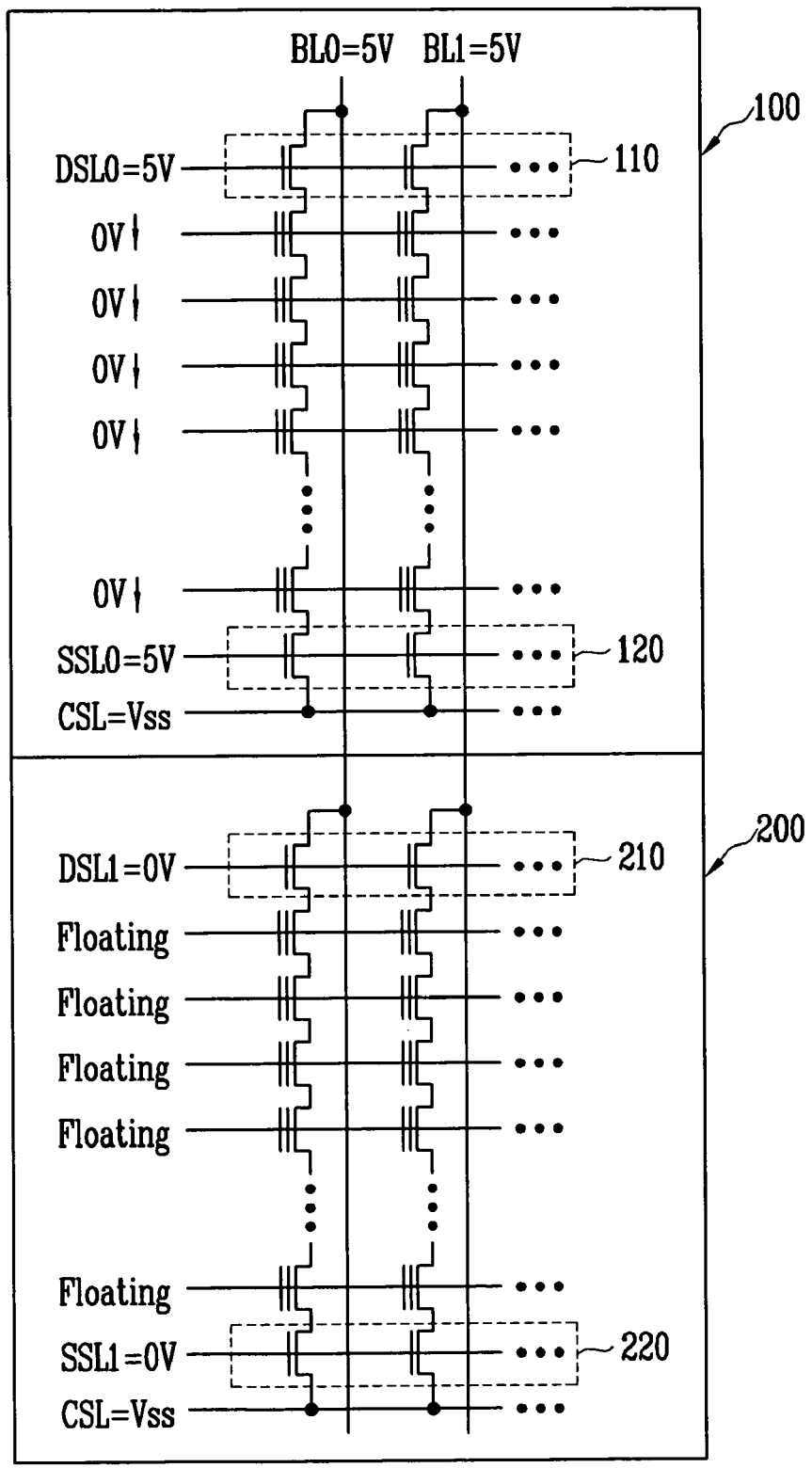
FIG. 4 is a simplified block diagram illustrating a recovery method for a NAND flash memory device according to an embodiment of the present invention.

FIG. 4 is a schematic block diagram for illustrating a recovery method for a NAND flash memory device according to an embodiment of the present invention.

Referring to FIG. 4, a predetermined bias is applied to bit lines BL0 and BL1 of a selected block 100 and a non-selected block 200. As an example, a 5 volt bias is used. Since bit lines BL0, BL1 are connected to the entire block, a first predetermined bias is applied to a drain select transistor 110 through a drain select line DSL0 to separate selected block 100 and non-selected block 200. That is, the first predetermined bias is applied through drain select line DSL0 of selected block 100 to turn on drain select transistor 110 and a bias of zero volt is applied through drain select line DSL1 of non-selected block 200 to turn on drain select transistor 210. A second predetermined bias is applied through source select line SSL0 of the selected block 100 to turn on a source select transistor 120 and a bias of zero volt is applied through source select line SSL1 of the non-selected block 200 to turn off a source select transistor 220.

The first predetermined bias applied through drain select line DSL0 and the second predetermined bias applied to source select line SSL0 of the selected block 100 can be the same as a bias applied through bit line BL1. The first predetermined bias applied through drain select line DSL0 and the second predetermined bias applied through source select line SSL0 of the selected block 100 can also be higher than a threshold voltage of drain select transistor 110 so that a sufficient transfer of the bias applied through bit lines BL0, BL1 to a cell is possible. In addition, the bias applied to a cell of selected block 100 can be recovered to a target value considering a transconductance (Gm) of the cell. A desired voltage can be applied by applying a voltage of opposite polarity to the threshold voltage. That is, if a target threshold voltage is −1.5V, zero volt bias can be applied to the gate and the gate bias can be controlled according to variation in the target threshold voltage. The cell gate of the non-selected block 200 can be floated and the ground voltage (Vss) can be applied to the source through common source line CSL.

As described, in the cell recovery process, by applying a high voltage to bit lines BL0, BL1, and by applying a negative bias to a cell gate, the current between bit lines BL0, BL1 and common source CS can be increased due to a negative bias of the semiconductor substrate.

In an alternative embodiment of the present invention, a method for cell recovery for a NAND flash memory device is provided. Referring again to FIG. 4, the method includes applying a first predetermined bias to a source through common source line CSL. As merely an example, a 5 volt bias is used. A second predetermined bias, is applied to drain select transistor 110 and source select transistor 120 through the drain select line DSL and the source select line SSL of selected cell block 100. The second predetermined bias can be the same or higher than the first predetermined bias. aA negative bias is applied to a cell gate. To increase the current between bit line BL and common source CS, a negative bias can be applied to the semiconductor substrate.

Figure 5:
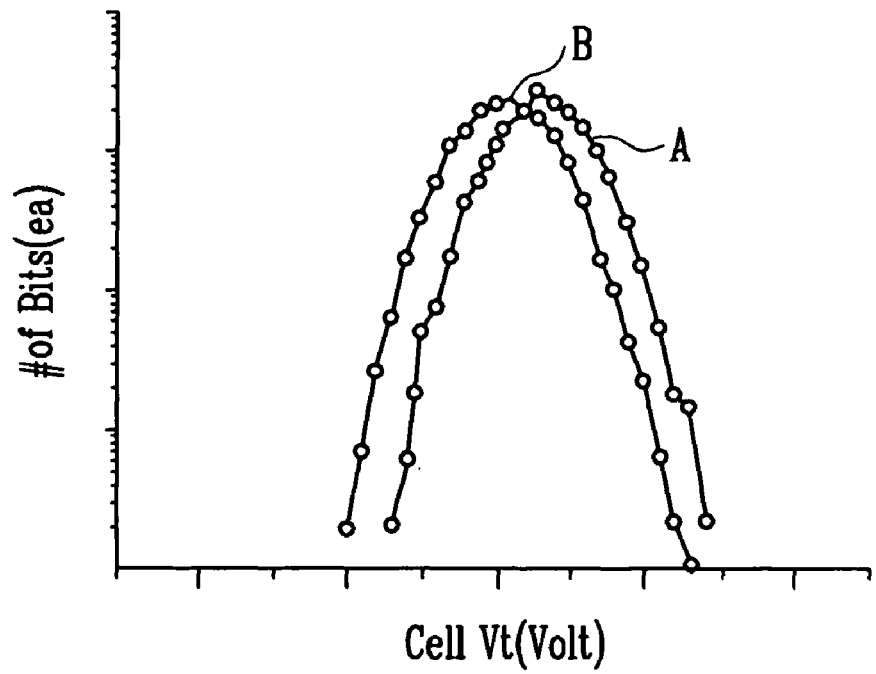
FIG. 5 is a simplified graph showing distribution of program threshold voltage in the program operation after a NAND flash memory device is recovered according to an embodiment of the present invention.

FIG. 5 is a simplified graph showing a distribution of a program threshold voltage in a program operation after a memory device is recovered according to embodiments of the present invention. A distribution of a threshold voltage in the case where peripheral cells are programmed is illustrated by plot A. The distribution of cell threshold voltage when peripheral cells are erased is illustrated in plot B As shown in FIG. 5, interference from states of the peripheral cell on cell threshold voltage is significantly reduced.

Figure 6:
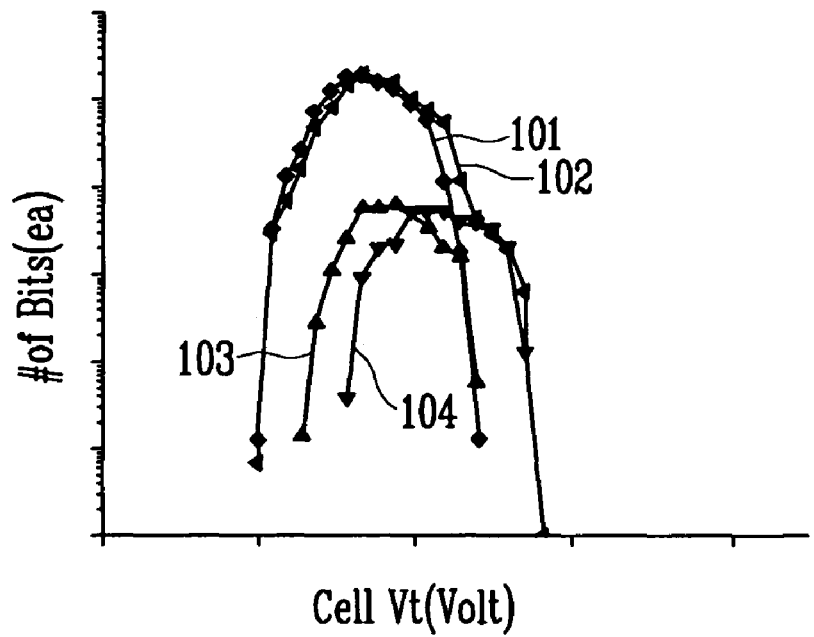
FIG. 6 is a simplified graph showing distribution of a cell threshold voltage when a NAND flash memory device is programmed by a step pulse method.

FIG. 6 is a simplified graph showing a distribution of a cell threshold voltage when a memory device is programmed by a step pulse method. As shown in FIG. 6, plot 101 illustrates a distribution of a program threshold voltage after a recovery of a cell block is performed and plot 102 illustrates a distribution of the program threshold voltage when the recovery of a cell block is not performed. Also shown in FIG. 6, plot 103 illustrates distribution of a program threshold voltage when a recovery of a page is performed and plot 104 illustrates a distribution of a program threshold voltage when a recovery of a page is not performed.

As shown in FIG. 6, even when a device is programmed using a step pulse method, the difference in threshold voltage distribution of a programmed cell and an erased cell is minimized as a result of a reduction of interference effect.

Although the foregoing description has been made with reference to the preferred embodiments, it is to be understood that changes and modifications of the present invention may be made by those ordinary skilled in the art without departing from the spirit and scope of the present invention and appended claims.

What is claimed is:

1. A method for recovery of a NAND flash memory device, the NAND flash memory device including a semiconductor substrate; a plurality of cell blocks, each of the cell blocks having a plurality of cell strings formed on the semiconductor substrate, each of the cell strings comprising a plurality of cells coupled in series; a drain select transistor formed between a cell string and a bit line of each of the plurality of the cell blocks; and a source select transistor formed between a cell string and a source region; the method comprising:
   erasing the NAND flash memory device;
   applying a first predetermined bias to each bit line of the plurality of cell blocks after erasing the NAND flash memory device, wherein the first predetermined bias is higher than 0V;
   applying a second predetermined bias to a drain select line of the drain select transistor of a selected cell block after erasing the NAND flash memory device, wherein the second predetermined bias is higher than 0V;
   applying a third predetermined bias to a source select line of the source select transistor of the selected cell block after erasing the NAND flash memory device, wherein the third predetermined bias is higher than 0V;
   applying a zero voltage to the source region after erasing the NAND flash memory device; and
   applying a fourth predetermined bias to cell gates of the selected cell block after erasing the NAND flash memory device, wherein the fourth predetermined bias is controlled according to a variation in a target threshold voltage of the selected of cell block,
   wherein the first predetermined bias, the second predetermined bias, the third predetermined bias, the zero voltage applied to the source region, and the fourth predetermined bias are applied so as to share a common time period of application.

2. The method of claim 1, wherein the second predetermined bias and the third predetermined bias are the same as the first predetermined bias.

3. The method of claim 1, wherein an erase threshold voltage of the cells is controlled by applying a negative bias to a cell gate of the selected cell block.

4. The method of claim 1, wherein a cell gate of the non-selected cell block is floated.

5. The method of claim 1, wherein a current between the bit line and the source is increased by applying a negative bias to the semiconductor substrate.

6. The method of claim 1, wherein the second predetermined bias and the third predetermined bias are higher than a threshold voltage of the drain select transistor.

7. The method of claim 1, wherein a zero voltage is applied to a drain select line and a source select line of a non-selected cell block after erasing the NAND flash memory device so as to also share the common time period of application.

* * * * *